United States Patent
Sakaguchi et al.

(10) Patent No.: US 8,647,923 B2
(45) Date of Patent: Feb. 11, 2014

(54) METHOD OF MANUFACTURING SEMICONDUCTOR DEVICE

(75) Inventors: Kiyofumi Sakaguchi, Mobara (JP); Takao Yonehara, Atsugi (JP); Nobuo Kawase, Yokohama (JP); Kenji Nakagawa, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/262,915

(22) PCT Filed: Apr. 2, 2010

(86) PCT No.: PCT/JP2010/002426
§ 371 (c)(1),
(2), (4) Date: Oct. 4, 2011

(87) PCT Pub. No.: WO2010/116694
PCT Pub. Date: Oct. 14, 2010

(65) Prior Publication Data
US 2012/0034759 A1 Feb. 9, 2012

(30) Foreign Application Priority Data

Apr. 6, 2009 (JP) ................................. 2009-092317
Apr. 6, 2009 (JP) ................................. 2009-092318

(51) Int. Cl.
*H01L 21/00* (2006.01)
(52) U.S. Cl.
USPC ................ 438/108; 438/118; 257/E21.503
(58) Field of Classification Search
USPC ...................... 438/108, 118; 257/E21.503
See application file for complete search history.

(56) References Cited

U.S. PATENT DOCUMENTS

| 6,503,778 B1 | 1/2003 | Yamauchi et al. |
| 6,638,835 B2 | 10/2003 | Roberds et al. |
| 6,872,635 B2 | 3/2005 | Hayashi et al. |
| 7,067,926 B2 | 6/2006 | Yamazaki et al. |

(Continued)

FOREIGN PATENT DOCUMENTS

| JP | 10-032307 A | 2/1998 |
| JP | 11-135712 A | 5/1999 |

(Continued)

OTHER PUBLICATIONS

Hiroyuki Sanda et al. "Fabrication and Characterization of CMOSFETs on Porous Silicon for Novel Device Layer Transfer." Center for Integrated Systems, Department of Electrical Engineering, Stanford University, CA 94305, U.S.A. Leading-Edge Technology Development Headquarters, Canon Inc., 2005.

*Primary Examiner* — Trung Q Dang
(74) *Attorney, Agent, or Firm* — Canon USA Inc IP Division

(57) ABSTRACT

A method of manufacturing a semiconductor device includes the steps of forming a plurality of first integrated circuits on the surface side of a first semiconductor substrate; forming a plurality of second integrated circuits in a semiconductor layer that is formed on a release layer provided on a second semiconductor substrate; bonding the two semiconductor substrates so that electrically bonding portions are bonded to each other to form a bonded structure; separating the second semiconductor substrate from the bonded structure at the release layer to transfer, to the first semiconductor substrate, the semiconductor layer in which the plurality of second integrated circuits are formed; and dicing the first semiconductor substrate to obtain stacked chips each including the first integrated circuit and the second integrated circuit.

8 Claims, 6 Drawing Sheets

(56) References Cited

U.S. PATENT DOCUMENTS

| | | |
|---|---|---|
| 7,511,380 B2 | 3/2009 | Yamazaki et al. |
| 2006/0088957 A1 | 4/2006 | Saeki |
| 2006/0138627 A1 | 6/2006 | Shaheen |
| 2012/0038039 A1* | 2/2012 | Sakaguchi et al. ............ 257/734 |

FOREIGN PATENT DOCUMENTS

| | | |
|---|---|---|
| JP | 11-26100 A | 9/1999 |
| JP | 11-261001 A | 9/1999 |
| JP | 2000-156459 A | 6/2000 |
| JP | 2001-015683 A | 1/2001 |
| JP | 2004-200522 A | 7/2004 |
| JP | 2005-044989 A | 2/2005 |
| JP | 2005-184023 A | 7/2005 |
| JP | 2006-019429 A | 1/2006 |
| JP | 2006-501641 A | 1/2006 |
| JP | 2007-096090 A | 4/2007 |
| WO | 2006/027981 A1 | 3/2006 |
| WO | 2007/111008 A1 | 10/2007 |

* cited by examiner

METHOD OF MANUFACTURING SEMICONDUCTOR DEVICE

TECHNICAL FIELD

The present invention relates to a method of manufacturing a semiconductor device used for a semiconductor memory such as a dynamic random access memory (DRAM) or a flash memory, or a logic integrated circuit (logic IC) such as a central processing unit (CPU) or a digital signal processor (DSP). In particular, the present invention relates to a method of manufacturing a so-called three-dimensionally mounted semiconductor device in which a plurality of chips each having an integrated circuit (IC) formed therein are stacked and packaged.

BACKGROUND ART

Non Patent Literature 1 describes a method of manufacturing a three-dimensionally mounted IC by transferring, to a handle substrate, a semiconductor layer having a complementary metal oxide semiconductor (CMOS) circuit formed therein. According to an example of such a method, a release layer composed of porous silicon is formed on a surface of a silicon wafer, a semiconductor layer composed of single-crystal silicon is epitaxially grown on the release layer, and a CMOS circuit is then formed in the semiconductor layer.

Subsequently, the semiconductor layer having the CMOS circuit formed therein is bonded to a handle substrate. Separation is conducted at the release layer to transfer the semiconductor layer to the handle substrate. This process is repeated a plurality of times to stack a plurality of semiconductor layers each having the CMOS circuit formed therein on the handle substrate.

Patent Literature 1 discloses a process in which a semiconductor layer having a transistor formed therein is bonded to a handle wafer having a back-side recess, with a polymer film therebetween, and the semiconductor layer is transferred to the handle wafer. This process is then repeated to form stacked transistors. Patent Literature 2 discloses a process of manufacturing a three-dimensionally mounted semiconductor device, the process including bonding two substrates having semiconductor layers formed by performing a separation step twice so that the semiconductor layers are bonded to each other, and lastly separating one of the substrates.

CITATION LIST

Patent Literature

PTL 1: U.S. Pat. No. 6,638,835
PTL 2: U.S. Pat. No. 7,067,926

Non Patent Literature

NPL 1: Proceeding of International Electron Device Meeting, Washington D.C., USA, December 2005, Hiroyuki Sanda et al.

SUMMARY OF INVENTION

Technical Problem

The transfer technology in the related art including the separation step is adopted in a so-called front-end of line in a process for manufacturing a semiconductor device. Therefore, this technology is not a sufficiently low-cost manufacturing method in view of a cost factor such as the yield.

The present invention has been achieved in consideration of the background art. The present invention provides a method of manufacturing a three-dimensionally mounted semiconductor device at a low cost in which a separation process is employed in a so-called back-end of line.

Solution to Problem

In view of the above problem, a method of manufacturing a semiconductor device of the present invention includes the steps of forming a plurality of first integrated circuits on the surface side of a first semiconductor substrate; forming a plurality of second integrated circuits in a semiconductor layer that is formed on a release layer provided on a second semiconductor substrate; bonding the first semiconductor substrate to the second semiconductor substrate so that electrically bonding portions of the first integrated circuits are bonded to electrically bonding portions of the second integrated circuits to form a bonded structure; separating the second semiconductor substrate from the bonded structure at the release layer to transfer, to the first semiconductor substrate, the semiconductor layer in which the plurality of second integrated circuits are formed; and dicing the first semiconductor substrate to which the plurality of second integrated circuits are transferred to obtain stacked chips each including the first integrated circuit and the second integrated circuit.

Another method of manufacturing a semiconductor device of the present invention includes the steps of forming a plurality of first integrated circuits on the surface side of a first semiconductor substrate; forming a plurality of second integrated circuits in a first semiconductor layer that is formed on a first release layer provided on a second semiconductor substrate; bonding the first semiconductor substrate to the second semiconductor substrate so that electrically bonding portions of the first integrated circuits are bonded to electrically bonding portions of the second integrated circuits to form a first bonded structure; separating the second semiconductor substrate from the first bonded structure at the first release layer to transfer, to the first semiconductor substrate, the first semiconductor layer in which the plurality of second integrated circuits are formed; forming a plurality of third integrated circuits in a second semiconductor layer that is formed on a second release layer provided on a third semiconductor substrate; bonding the first semiconductor layer to the second semiconductor layer so that electrically bonding portions of the second integrated circuits are bonded to electrically bonding portions of the third integrated circuits to form a second bonded structure; separating the third semiconductor substrate from the second bonded structure at the second release layer to transfer, to the first semiconductor substrate, the second semiconductor layer in which the plurality of third integrated circuits are formed; and dicing the first semiconductor substrate to which the plurality of second integrated circuits and third integrated circuits are transferred to obtain stacked chips each including the first integrated circuit, the second integrated circuit, and the third integrated circuit.

Another method of manufacturing a semiconductor device of the present invention includes the steps of forming a plurality of first integrated circuits on the surface side of a first semiconductor substrate; forming a plurality of second integrated circuits in a semiconductor layer that is formed on a release layer provided on a second semiconductor substrate, the chip size of the second integrated circuits being smaller than that of the first integrated circuits; bonding the first semiconductor substrate to the second semiconductor substrate so that electrically bonding portions of the first integrated circuits are bonded to electrically bonding portions of the second integrated circuits to form a bonded structure; separating the second semiconductor substrate from the bonded structure at the release layer to transfer, to the first semiconductor substrate, the semiconductor layer in which the plurality of second integrated circuits are formed; and dicing the first semiconductor substrate to which the second integrated circuits are transferred to obtain stacked chips each including the first integrated circuit and the second integrated circuit.

Another method of manufacturing a semiconductor device of the present invention includes the steps of forming a plurality of first integrated circuits on the surface side of a first semiconductor substrate; forming a plurality of second integrated circuits in a first semiconductor layer that is formed on a first release layer provided on a second semiconductor substrate, the chip size of the second integrated circuits being smaller than that of the first integrated circuits; bonding the first semiconductor substrate to the second semiconductor substrate so that electrically bonding portions of the first integrated circuits are bonded to electrically bonding portions of the second integrated circuits to form a first bonded structure; separating the second semiconductor substrate from the first bonded structure at the first release layer to transfer, to the first semiconductor substrate, the first semiconductor layer in which the second integrated circuits are formed; forming a plurality of third integrated circuits in a second semiconductor layer that is formed on a second release layer provided on a third semiconductor substrate, the chip size of the third integrated circuits being smaller than that of the first integrated circuits; bonding the first semiconductor layer to the second semiconductor layer so that electrically bonding portions of the second integrated circuits are bonded to electrically bonding portions of the third integrated circuits to form a second bonded structure; separating the third semiconductor substrate from the second bonded structure at the second release layer to transfer, to the first semiconductor substrate, the second semiconductor layer in which the plurality of third integrated circuits are formed; and dicing the first semiconductor substrate to which the plurality of second integrated circuits and third integrated circuits are transferred to obtain stacked chips each including the first integrated circuit, the second integrated circuit, and the third integrated circuit.

Advantageous Effects of Invention

According to the present invention, by performing a separation process after through-electrodes (also referred to as "through-silicon via: TSV"), electrically bonding portions, and the like are formed, i.e., by performing a separation process in the back-end of line, a three-dimensionally mounted semiconductor device can be manufactured at a low cost.

DESCRIPTION OF EMBODIMENTS

Figure 1A:
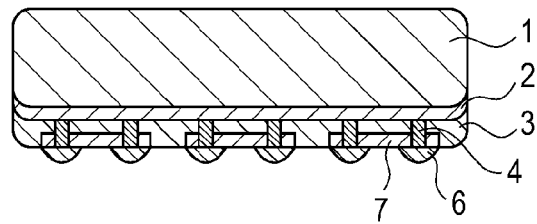
FIG. 1A is a schematic cross-sectional view illustrating a method of manufacturing a semiconductor device according to an embodiment of the present invention.

The present invention will now be described in more detail with reference to the accompanying drawings. Note that the same components are generally assigned the same reference numerals and a description thereof is omitted.

First Embodiment

FIGS. 1A to 1E are schematic cross-sectional views illustrating a method of manufacturing a semiconductor device according to an embodiment of the present invention.

First, a semiconductor substrate such as a bulk silicon wafer or an epitaxial silicon wafer is prepared as a first semiconductor substrate 11. Subsequently, a plurality of first integrated circuits 17 are formed on the surface side of the first semiconductor substrate 11 by a well-known manufacturing process. Herein, the term "first integrated circuits" refers to integrated circuit portions that are to be formed into chips (dies) in a subsequent step. For example, in the case of a DRAM or a flash memory, the first integrated circuits may be a large number of memory cells, selective circuits that select memory cells, signal processing circuits for reading signals from memory cells and writing signals to memory cells, and the like. Preferably, this step does not include a separation step or a transfer step.

As shown in FIG. 1A, a second semiconductor substrate 1, for example, a bulk silicon wafer is prepared. A release layer 2 composed of, for example, porous silicon is provided on the second semiconductor substrate 1, and a semiconductor layer 3 composed of, for example, single-crystal silicon is provided on the release layer 2. A plurality of second integrated circuits 7 (in this example, three second integrated circuits 7 shown in the figure) are formed on the semiconductor layer 3. Furthermore, elements such as MOS transistors and multilayer wiring for connecting a large number of MOS transistors are formed, and through-holes, which are also called via-holes, are then formed through the semiconductor layer 3. An insulating film is formed on the inner wall surfaces of the through-holes to form insulating inner wall surfaces. The through-holes are filled with an electrical conductor to form through-electrodes (also referred to as "grooves") 4 (through-silicon-via technology). In this step, the depth Dt of the grooves 4 is controlled to be smaller than the thickness t3 of the semiconductor layer 3 by adjusting the etching time. More specifically, the grooves 4 are shallowly formed to the extent that the bottoms of the electrical conductive layers in the grooves 4 do not reach the release layer 2 so that the relationship Dt<t3 is satisfied. The thickness t3 of the semiconductor layer 3 can be selected from the range of 1.0 micrometer or more and 20 micrometers or less, and more preferably in the range of 1.0 micrometer or more and 10 micrometers or less. For example, when a CMOS circuit is formed, the thickness t3 of the semiconductor layer 3 is 1.0 micrometer or more and 2.0 micrometers or less. When a memory structure is formed, the thickness t3 of the semiconductor layer 3 is 1.0 micrometer or more and 10.0 micrometers or less, though the thickness t3 varies depending on the capacitance for storing various memory charges. The depth Dt of the holes or the grooves 4 may be a half or more of the thickness t3 of the semiconductor layer 3 so that a remaining portion having a thickness of one-twentieth or less of the thickness t3 of the semiconductor layer 3 remains at the lower portion of a groove. Specifically, the through-holes are designed so as to satisfy mathematical expression 1. The electrical conductor may be any one of tin (Sn), nickel (Ni), copper (Cu), gold (Au), and aluminum (Al) or an alloy containing at least one of these elements.

$$t3/2 \leq Dt < t3 - (t3/20)$$ [Math.1]

Subsequently, electrically bonding portions 6 (also referred to as "bonding pads") composed of solder or gold are formed. As a result, the structure shown in FIG. 1A is prepared. For the ease of understanding, the through-electrodes (through-silicon via: TSV) and the electrically bonding portions are shown inside each chip of an integrated circuit in the figure. In general, however, such through-electrodes and electrically bonding portions are provided in a peripheral portion of each chip of an integrated circuit. Preferably, this step also does not include a separation step or a transfer step.

In the present invention, the through-electrodes are connected to wiring of the integrated circuit of each chip and have a function of electrically connecting to wiring when chips are stacked. Specifically, the through-electrodes can be a power supply line, an input/output line, a clock signal line, and a ground line.

A release layer composed of a porous material can be used as the release layer 2. An example thereof is a porous silicon layer obtained by anodizing a surface of a silicon wafer. In the anodization, a $P^+$-type or $N^+$-type substrate can be used or a substrate can be doped with a $P^+$-type or $N^+$-type impurity so that at least a region to be anodized is $P^+$-type or $N^+$-type. In the present invention, in particular, a $P^+$-type substrate can be used or a substrate can be doped with a $P^+$-type impurity so that at least a region to be anodized is $P^+$-type.

In the present invention, the electrical conductivity may be increased by controlling the $P^+$-type or $N^+$-type region resistivity, and a part of the porous layer may be left as required so that when chips are formed, the porous layer can function as a shield against noise such as electromagnetic waves.

Figure 1B:
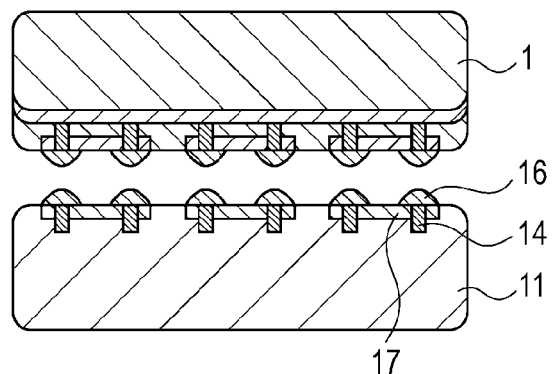
FIG. 1B is a schematic cross-sectional view illustrating the method of manufacturing the semiconductor device according to the embodiment of the present invention.

As shown in FIG. 1B, the first semiconductor substrate 11 is prepared in advance, and a plurality of first integrated circuits 17 are formed on a surface of the first semiconductor substrate 11. Through-electrodes 14 are shown in FIG. 1B, however, in the case where the first semiconductor substrate 11 is not formed as a thin layer, the through-electrodes 14 are not always necessary. Electrically bonding portions 16 composed of solder or gold are formed on the surface of each of the first integrated circuits 17. Thus, a structure composed of the semiconductor substrate having the first integrated circuits 17 formed therein and used as a handle substrate is prepared.

Next, as shown in FIG. 1B, the second semiconductor substrate 1 and the first semiconductor substrate 11 are arranged so that the surface having the electrically bonding portions 6 thereon and the surface having the electrically bonding portions 16 thereon face each other. The first semiconductor substrate 11 is bonded to the second semiconductor substrate 1 in an area where the electrically bonding portions are not provided, with an adhesive 18 therebetween. In this step, the electrically bonding portions are also bonded to each other to form an electrical short-circuit. As a result, a bonded structure is prepared.

When an adhesive is used, the periphery of the flip-chip bonded first and second semiconductor substrates (bonded structure) is temporarily covered with a sealing member composed of, for example, an acrylic resin using a dispenser or the like. The sealing member is cured so that an opening is provided therein. An adhesive having a lower viscosity is introduced into the inner space through the opening and then cured. This technique of filling an adhesive is the same as a known method of filling a liquid crystal material, the method being employed in a method of producing a liquid crystal panel. Alternatively, a particulate adhesive (adhesive beads) may be dispersed and arranged in an area where the electrically bonding portions are not provided in a surface of one of the semiconductor substrates. When the other semiconductor substrate is bonded to the semiconductor substrate by flip-chip bonding, the adhesive beads may be deformed and cured at the same time. The adhesive interposed between the first and second semiconductor substrates by the above method is used in order to increase the adhesive strength of the two semiconductor substrates without relying only on the adhesive force of the electrically bonding portions when the semiconductor layer 3 is subsequently separated at the release layer 2.

The adhesive usable in the present invention may be selected from adhesives that satisfy low viscosity, low impurities, high weather resistance, low outgassing, low shrinkage, heat resistance at 160 degrees Celsius, high adhesive force, low thermal expansion coefficient, high thermal conductivity, and high volume resistivity. Examples of adhesives that satisfy these conditions include acrylic, methacrylic (acrylate), epoxy (acid anhydride curing agent), polyimide, and polyimide-amide (polyimide=nylon modified) adhesives. The adhesive is applied onto a bonding surface (surface of a substrate or a chip) and dried to an extent that a certain degree of tackiness remains. Subsequently, a heat treatment is conducted at a predetermined temperature while applying a predetermined load.

Alternatively, an anisotropic conductive film or paste, which electrically short-circuits in the thickness direction and insulates between adjacent bonding pads in the lateral direction, may be used as a material functioning as both an adhesive for bonding and electrical conduction.

In the present invention, the substrates may be bonded by using a film (hot-melt sheet) functioning as an adhesive instead of or in addition to the adhesive. Examples of such a film usable in the present invention include die bonding films FH series, DF series, and HS series, and films for under-filling UF series, all of which are produced by Hitachi Chemical Co., Ltd.

Figure 1C:
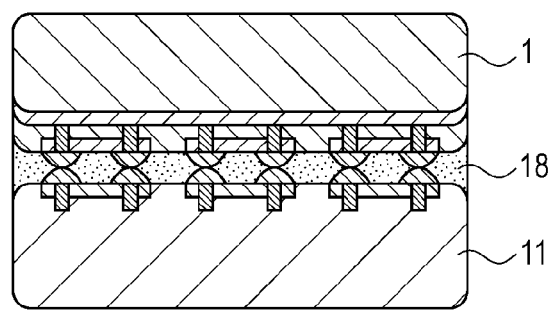
FIG. 1C is a schematic cross-sectional view illustrating the method of manufacturing the semiconductor device according to the embodiment of the present invention.
Figure 1D:
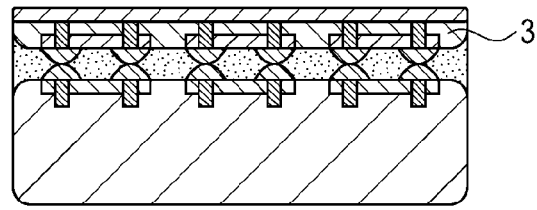
FIG. 1D is a schematic cross-sectional view illustrating the method of manufacturing the semiconductor device according to the embodiment of the present invention.

Subsequently, a high-pressure water stream that does not contain abrasive particles is sprayed onto the side surfaces of the structure shown in FIG. 1C, which is prepared by bonding the two semiconductor substrates 1 and 11. Thus, the second semiconductor substrate 1 is separated from the bonded structure at the release layer 2. That is, the semiconductor layer 3 is detached from the second semiconductor substrate 1. Consequently, as shown in FIG. 1D, the semiconductor layer 3 having a plurality of integrated circuits formed therein is moved and transferred from the second semiconductor substrate 1 to the first semiconductor substrate 11.

The separation method is not limited to the water jet method described above. Alternatively, a high-pressure gas such as nitrogen may be sprayed by a gas jet method. In short, it is sufficient to spray a fluid having the function of a wedge. Alternatively, a wedge composed of a solid such as a metal may be hammered between the two semiconductor substrates to mechanically separate the semiconductor substrates. In the figure, the semiconductor substrates are shown so that the side surfaces of the two semiconductor substrates are aligned. In reality, however, a recess (depression) is formed between the two semiconductor substrates due to the presence of chamfered portions (beveled portions) of the semiconductor substrates. Accordingly, when a force vector in a direction in which the two semiconductor substrates are separated from each other is applied by inserting a wedge into the recess, the two semiconductor substrates are separated at the release layer 2, which has a low mechanical strength. Alternatively, first, the separation of the bonded structure may be started using a solid wedge, and the bonded structure may then be completely separated using a fluid wedge.

In this step, the release layer 2 after separation may remain at the semiconductor layer side of the first semiconductor substrate 11, at the second semiconductor substrate 1 side, or both the semiconductor layer side of the first semiconductor substrate 11 and the second semiconductor substrate 1 side. In particular, when a stacked layer including at least two porous layers composed of porous materials having different porosities is used as the release layer 2, cracks are formed in one of the porous layers having a relatively high porosity near the interface of the porous layers. Consequently, the semiconductor substrates are separated along the interface of the porous layers. As a result, the thickness of the remaining porous layer becomes uniform over the entire surface of the semiconductor substrate having integrated circuits formed thereon (refer to FIG. 1D). Subsequently, the remaining release layer 2 is removed by etching or the like, as required, to expose the reverse surface of the semiconductor layer 3. The reverse surface of the semiconductor layer 3 is etched until the through-electrodes 4 are exposed. Electrically bonding portions 8 are then formed with solder, gold, or the like.

Figure 1E:
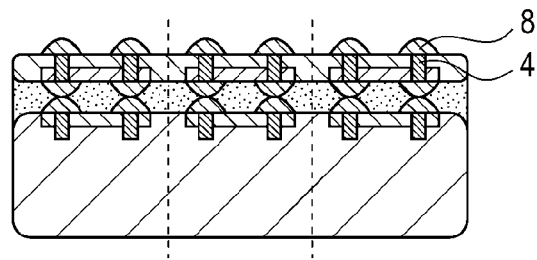
FIG. 1E is a schematic cross-sectional view illustrating the method of manufacturing the semiconductor device according to the embodiment of the present invention.

As a result, as shown in FIG. 1E, a structure in which two integrated circuits are stacked is obtained. When the number of layers of an integrated circuit to be stacked is two, grooves are formed in regions (represented by the broken lines in FIG. 1E) between adjacent integrated circuits with a dicing saw to cut the bonded structure. Thus, dicing is conducted so that the respective integrated circuits are independently separated into chips.

Thus, a stacked chip including at least a first integrated circuit and a second integrated circuit, that is, a three-dimensionally mounted semiconductor device can be manufactured.

Second Embodiment

In this embodiment, three or more semiconductor layers or semiconductor substrates each having integrated circuits formed therein are stacked.

First, a structure 30 that is the same as the structure shown in FIG. 1E, the structure being obtained in the first embodiment, is prepared. A structure 31 that is the same as the structure shown in FIG. 1A is also prepared.

Next, these structures 30 and 31 are bonded to each other with an adhesive therebetween. Furthermore, separation is conducted at a release layer 22, thus stacking three or more semiconductor layers each having integrated circuits formed therein.

Figure 2A:
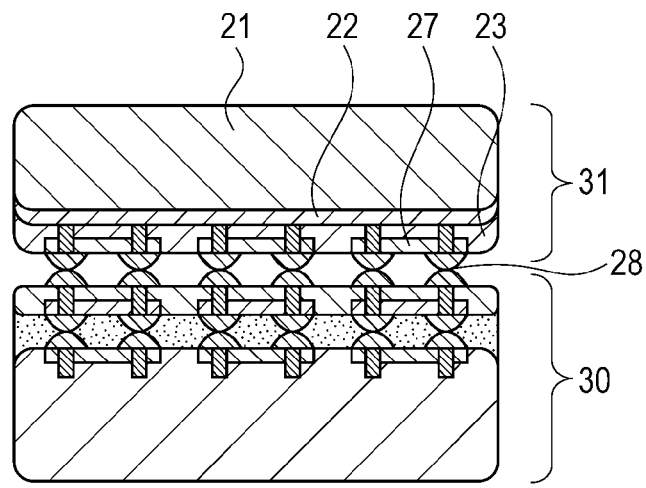
FIG. 2A is a schematic cross-sectional view illustrating a method of manufacturing a semiconductor device according to another embodiment of the present invention.
Figure 2B:
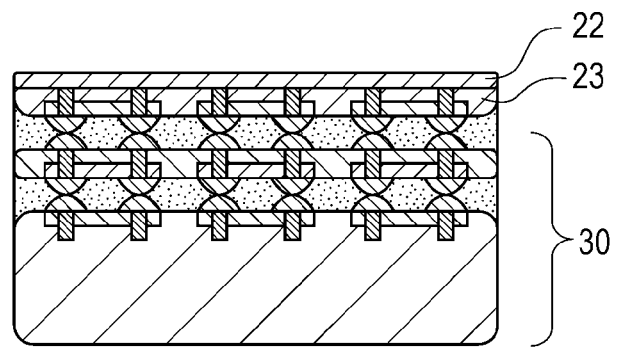
FIG. 2B is a schematic cross-sectional view illustrating the method of manufacturing the semiconductor device according to the other embodiment of the present invention.

The same methods as the method of bonding semiconductor substrates and method of separating the semiconductor substrates used in the first embodiment can be employed. FIG. 2B shows a state in which a second semiconductor layer 23 having integrated circuits formed therein is transferred to the stacked structure 30. A remaining porous layer (release layer) 22 is then removed according to need.

Figure 2C:
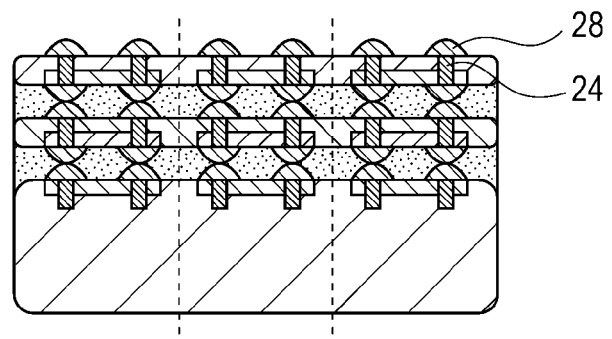
FIG. 2C is a schematic cross-sectional view illustrating the method of manufacturing the semiconductor device according to the other embodiment of the present invention.

Subsequently, as shown in FIG. 2C, through-electrodes 24 formed through the semiconductor layer 23 are exposed as in the first embodiment. Electrically bonding portions 28 composed of solder or gold are then formed on the through-electrodes 24.

Furthermore, grooves are formed in regions (represented by the broken lines in FIG. 2C) between adjacent integrated circuits with a dicing saw to cut the bonded structure shown in FIG. 2C. Thus, dicing is conducted so that the respective integrated circuits are independently separated into chips.

Figure 3:
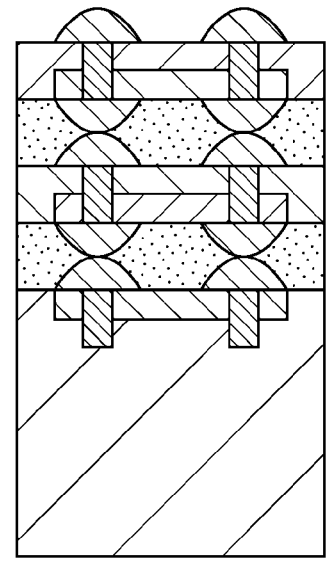
FIG. 3 is a schematic cross-sectional view of a semiconductor device according to another embodiment of the present invention.

FIG. 3 shows a stacked chip in which at least three integrated circuits are stacked, that is, a three-dimensionally mounted semiconductor device prepared as described above. Subsequently, the semiconductor device is die-bonded on a mounting substrate composed of a metal, a ceramic, or the like and then packaged. In FIG. 3, the dimension in the vertical direction is enlarged. However, in reality, the chip size (the length in the horizontal direction in the figure) is significantly larger than the thickness (the length in the vertical direction in the figure).

In the above embodiment, the integrated circuits formed on the first semiconductor substrate 11, the semiconductor layer 3, and the semiconductor layer 23 may be the same circuit or different circuits. In the case of the same circuit, a semiconductor memory, such as a DRAM, which requires a memory holding operation, or a non-volatile semiconductor memory, such as an electrically erasable and programmable read only memory (EEPROM) or a magnetoresistive random access memory (MRAM), which are called flash memory, may be used as the integrated circuit. The number of stacks is also not limited to 3, as shown in the figures. The number of stacks may be 8 or more, and more preferably 12 or more.

When the semiconductor substrate 11 is not formed as a thin layer, only the integrated circuits formed on the semiconductor substrate 11 may be formed as circuits (for example, logic ICs) different from other integrated circuits.

Third Embodiment

This embodiment is shown by a partially enlarged view of a stacked chip obtained by a method of manufacturing a semiconductor device of the present invention.

Figure 4:
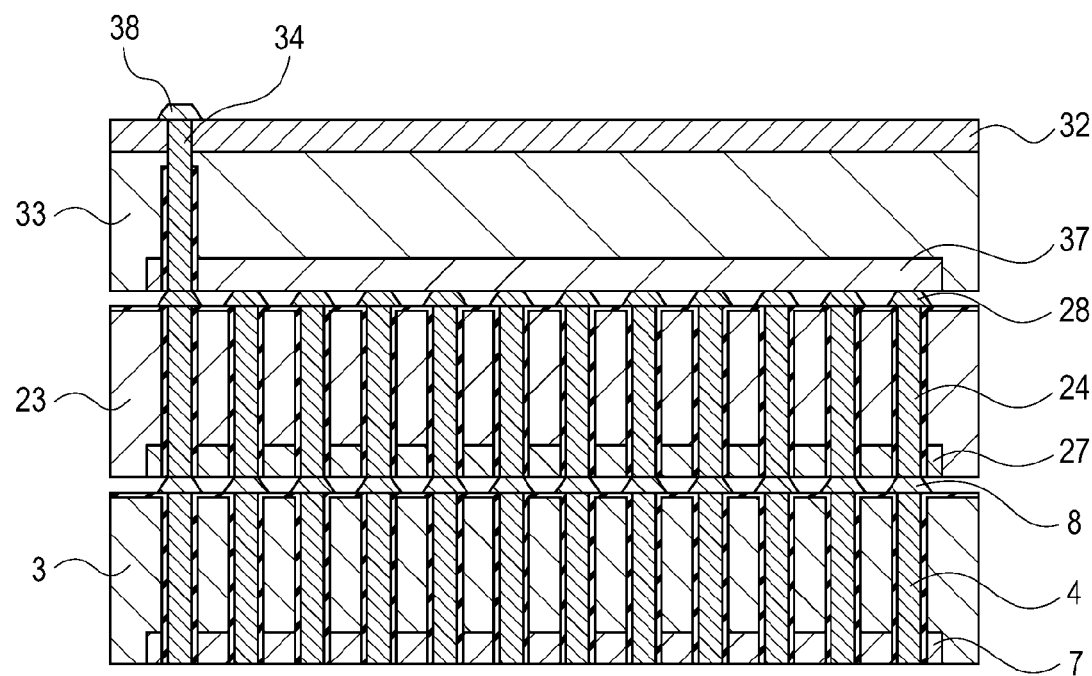
FIG. 4 is a schematic cross-sectional view of a semiconductor device according to another embodiment of the present invention.

FIG. 4 shows a cross section of a portion where three integrated circuits having the same chip size are stacked. Another integrated circuit chip (not shown) having the same chip size is disposed on the lower part of FIG. 4. A stacked chip of this embodiment is obtained by stacking the structure shown in FIG. 4 on the other integrated circuit chip.

Through-electrodes 4 are provided through a semiconductor layer 3 which includes an integrated circuit 7 such as a semiconductor memory. Solder bumps 8 functioning as electrically bonding portions are provided on the semiconductor layer 3. A semiconductor layer 23 which includes an integrated circuit 27 composed of the same semiconductor memory as the above is stacked on the solder bumps 8. Through-electrodes 24 are provided through the semiconductor layer 23, and solder bumps 28 functioning as electrically bonding portions are provided on the semiconductor layer 23.

Furthermore, a semiconductor layer 33 which includes an integrated circuit 37 composed of a semiconductor memory is stacked on the solder bumps 28. In this embodiment, a release layer 32 is not removed but is left on the top semiconductor layer 33.

A through-electrode 34 is arranged so as to be superposed on the lower through-electrodes 24 and 4. These through-electrodes are short-circuited so as to provide conduction therebetween. In each of the semiconductor layers 3, 23, and 33, since the inner walls of the through-holes are covered with insulating films, each of the semiconductor layers 3, 23, and 33 is not short-circuited with the insides of the through-holes. On the other hand, the release layer 32, which is composed of a porous material and which is left on the surface of the top semiconductor layer 33, is a low-resistance layer composed of silicon containing a high concentration of boron. Accordingly, the release layer 32 is short-circuited with the through-electrode 34 so that the release layer 32 can be used as an electrical shield layer, thereby preventing malfunction of the stacked chip, electrostatic discharge damage, and the like. The through-electrode 34 and the through-electrodes 4 and 24 connected thereto function as a body contacts that electrically short-circuit P-type body portions of the semiconductor layers. The body contacts electrically short-circuit the P-type body portions (common portions of separated semiconductor layers) of pMOS transistors, in which N-type semiconductor wells are formed, through wiring layers (not shown) and are grounded. Alternatively, a $P^+$-semiconductor layer doped at a high concentration or a metal layer may be provided instead of the release layer 32 composed of a porous material.

Fourth Embodiment

FIGS. 5A to 5E are schematic cross-sectional views illustrating a method of manufacturing a semiconductor device according to an embodiment of the present invention.

First, a semiconductor substrate such as a bulk silicon wafer or an epitaxial silicon wafer is prepared as a first semiconductor substrate 11. Subsequently, a plurality of first integrated circuits 17 are formed on the surface side of the first semiconductor substrate 11 by a well-known manufacturing process. Herein, the term "first integrated circuits" refers to integrated circuit portions that are to be formed into chips (dies) in a subsequent step. For example, each of the first integrated circuits is a logic IC such as a CPU or a DSP. Preferably, this step does not include a separation step or a transfer step.

Figure 5A:
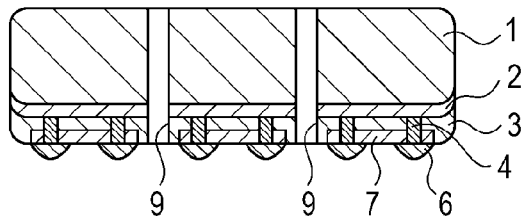
FIG. 5A is a schematic cross-sectional view illustrating a method of manufacturing a semiconductor device according to another embodiment of the present invention.

As shown in FIG. 5A, a second semiconductor substrate 1, for example, a bulk silicon wafer is prepared. A release layer 2 composed of, for example, porous silicon is provided on the second semiconductor substrate 1, and a semiconductor layer 3 composed of, for example, single-crystal silicon is provided on the release layer 2. A plurality of second integrated circuits 7 (in this example, three second integrated circuits 7 shown in the figure) each having a smaller chip size than that of the first integrated circuits are formed on the semiconductor layer 3. Herein, each of the second integrated circuits can be a semiconductor memory such as a DRAM or a flash memory. For example, in the case of a semiconductor memory, the second integrated circuits include a large number of memory cells, selective circuits that select memory cells, signal processing circuits for reading signals from memory cells and writing signals to memory cells, and the like.

Furthermore, elements such as MOS transistors and multilayer wiring for connecting a large number of MOS transistors are formed, and through-holes also called "via-holes" are then formed through the semiconductor layer 3. An insulating film is formed on the inner wall surfaces of the through-holes to form insulating inner wall surfaces. The through-holes are filled with an electrical conductor to form through-electrodes (grooves) 4 (through-silicon-via technology). In this step, the depth Dt of the grooves 4 is controlled to be smaller than the thickness t3 of the semiconductor layer 3 by adjusting the etching time. Specifically, the grooves 4 are shallowly formed to the extent that the bottoms of the electrically conductive layers in the grooves 4 do not reach the release layer 2 so that the relationship Dt<t3 is satisfied. The thickness t3 of the semiconductor layer 3 can be selected from the range of 1.0 micrometer or more and 20 micrometers or less, and more preferably in the range of 1.0 micrometer or more and 10 micrometers or less. For example, when a CMOS circuit is formed, the thickness t3 of the semiconductor layer 3 is 1.0 micrometer or more and 2.0 micrometers or less. When a memory structure is formed, the thickness t3 of the semiconductor layer 3 is 1.0 micrometer or more and 10.0 micrometers or less, though the thickness t3 varies depending on the capacitance for storing various memory charges. The depth Dt of the holes or grooves 4 may be a half or more of the thickness t3 of the semiconductor layer 3 so that a remaining portion having a thickness of one-twentieth or less of the thickness t3 of the semiconductor layer 3 remains at the lower portion of a groove. Specifically, the through-holes are designed so as to satisfy mathematical expression 1 above. The electrical conductor may be any one of tin (Sn), nickel (Ni), copper (Cu), gold (Au), and aluminum (Al) or may be an alloy containing at least one of these elements.

Subsequently, electrically bonding portions 6 (also referred to as "bonding pads") composed of solder or gold are formed. As a result, the structure shown in FIG. 5A is prepared. For the ease of understanding, the through-electrodes and the electrically bonding portions are shown inside each chip of an integrated circuit in the figure. In general, however, a plurality of the through-electrodes and electrically bonding portions are provided in a peripheral portion of each chip of an integrated circuit. Preferably, this step also does not include a separation step or a transfer step.

Next, grooves 9 are formed between adjacent integrated circuits 7 using a dicing saw. As a result of this dicing, the integrated circuits 7 are independently separated into integrated circuit chips (small chip structures).

In the present invention, the through-electrodes are connected to wiring of the integrated circuit of each chip and have a function of electrically connecting to wiring when chips are stacked. Specifically, the through-electrodes can be a power supply line, an input/output line, a clock signal line, and a ground line.

A release layer composed of a porous material can be used as the release layer 2. An example thereof is a porous silicon layer obtained by anodizing a surface of a silicon wafer. In the anodization, a $P^+$-type or $N^+$-type substrate can be used or a substrate can be doped with a $P^+$-type or $N^+$-type impurity so that at least a region to be anodized is $P^+$-type or $N^+$-type. In the present invention, in particular, a $P^+$-type substrate can be used or a substrate can be doped with a $P^+$-type impurity so that at least a region to be anodized is $P^+$-type.

In the present invention, the electrical conductivity may be increased by controlling the $P^+$-type or $N^+$-type region resistivity, and a part of the porous layer may be left as required so that when chips are formed, the porous layer can function as a shield against noise such as electromagnetic waves.

Figure 5B:
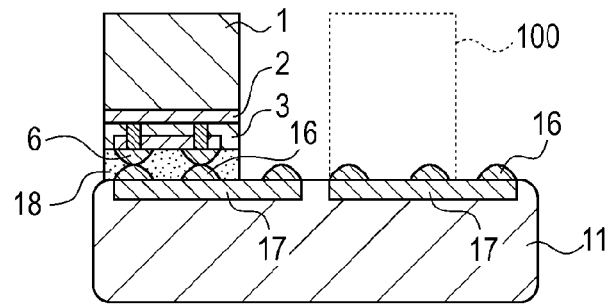
FIG. 5B is a schematic cross-sectional view illustrating the method of manufacturing the semiconductor device according to the other embodiment of the present invention.

As shown in FIG. 5B, the first semiconductor substrate 11 is prepared in advance, and a plurality of first integrated circuits 17 are formed on a surface of the first semiconductor substrate 11. Through-electrodes are not provided in the first semiconductor substrate 11. In the case where the first semiconductor substrate 11 is formed as a thin layer, through-electrodes may be formed in each semiconductor layer region where the first integrated circuit 17 is provided, and the reverse surface of the first semiconductor substrate 11 may be ground and polished to expose the bottom surface of each of the through-electrodes, thus forming electrically bonding portions.

Electrically bonding portions 16 composed of solder or gold are formed on the surface of each of the first integrated circuits 17. Thus, a structure composed of the semiconductor substrate having the first integrated circuits 17 formed therein and used as a handle substrate is prepared.

Next, as shown in FIG. 5B, a diced second semiconductor substrate 1 and the first semiconductor substrate 11 are arranged so that the surface having the electrically bonding portions 6 thereon and the surface having the electrically bonding portions 16 thereon face each other. The first semiconductor substrate 11 is bonded to the diced second semiconductor substrate 1 in an area where the electrically bonding portions are not provided, with an adhesive 18 therebetween. In this step, the electrically bonding portions are also bonded to each other to form an electrical short-circuit. As a result, a bonded structure is prepared.

When an adhesive is used, the periphery of the flip-chip bonded first and second semiconductor substrates (bonded structure) is temporarily coverer with a sealing member composed of, for example, an acrylic resin using a dispenser or the like. The sealing member is cured so that an opening is provided therein. An adhesive having a lower viscosity is introduced into the inner space through the opening and then cured. This technique of filling an adhesive is the same as a known method of filling a liquid crystal material, the method being employed in a method of producing a liquid crystal panel. Alternatively, a particulate adhesive (adhesive beads) may be dispersed and arranged in an area where the electrically bonding portions are not provided in a surface of one of the semiconductor substrates. When the other semiconductor substrate is bonded to the semiconductor substrate by flip-chip bonding, the adhesive beads may be deformed and cured at the same time. The adhesive interposed between the first and second semiconductor substrates by the above method is used in order to increase the adhesive strength of the two semiconductor substrates without relying only on the adhesive force of the electrically bonding portions when the semiconductor layer 3 is subsequently separated at the release layer 2.

Similarly, a small chip structure 100 which has an integrated circuit formed therein and which is independently separated is also bonded on the adjacent first integrated circuit 17.

The adhesive usable in the present invention may be selected from adhesives that satisfy low viscosity, low impurities, high weather resistance, low outgassing, low shrinkage, heat resistance at 160 degrees Celsius, high adhesive force, low thermal expansion coefficient, high thermal conductivity, and high volume resistivity. Examples of adhesives that satisfy these conditions include acrylic, methacrylic (acrylate), epoxy (acid anhydride curing agent), polyimide, and polyimide-amide (polyimide=nylon modified) adhesives. The adhesive is applied onto a bonding surface (surface of a substrate or a chip) and dried to an extent that a certain degree of tackiness remains. Subsequently, a heat treatment is conducted at a predetermined temperature while applying a predetermined load.

Alternatively, an anisotropic conductive film or paste, which electrically short-circuits in the thickness direction and insulates between adjacent electrically bonding portions in the lateral direction, may be used as a material functioning as both an adhesive for bonding and electrical conduction.

In the present invention, the substrates may be bonded by using a film (hot-melt sheet) functioning as an adhesive instead of or in addition to the adhesive. Examples of such a film usable in the present invention include die bonding films FH series, DF series, and HS series, and films for under-filling UF series, all of which are produced by Hitachi Chemical Co., Ltd.

Figure 5C:
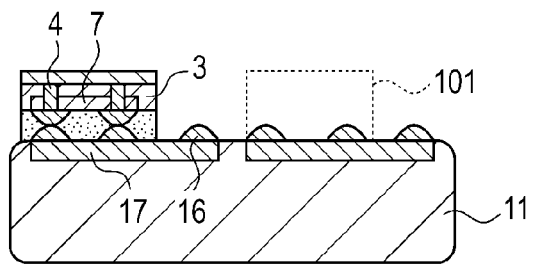
FIG. 5C is a schematic cross-sectional view illustrating the method of manufacturing the semiconductor device according to the other embodiment of the present invention.

Subsequently, a high-pressure water stream that does not contain abrasive particles is sprayed onto the side surfaces of the structure shown in FIG. 5B, which is prepared by bonding the two semiconductor substrates 1 and 11. Thus, the second semiconductor substrate 1 is separated from the bonded structure at the release layer 2. That is, the semiconductor layer 3 is detached from the second semiconductor substrate 1. Consequently, as shown in FIG. 5C, the second semiconductor substrate 1 is removed, and the semiconductor layer 3 having the integrated circuit 7 formed therein is moved and transferred from the second semiconductor substrate 1 to the first semiconductor substrate 11.

The separation method is not limited to the so-called water jet method described above. Alternatively, a high-pressure gas such as nitrogen may be sprayed by a gas jet method. In short, it is sufficient to spray a fluid having the function of a wedge. Alternatively, a wedge composed of a solid such as a metal may be hammered between the two semiconductor substrates to mechanically separate the semiconductor substrates. In the figure, the semiconductor substrates are shown so that the side surfaces of the two semiconductor substrates are aligned. In reality, however, a recess (depression) is formed between the two semiconductor substrates due to the presence of chamfered portions (beveled portions) of the semiconductor substrates. Accordingly, when a force vector in a direction in which the two semiconductor substrates are separated from each other is applied by inserting a wedge into the recess, the two semiconductor substrates are separated at the release layer 2, which has a low mechanical strength. Alternatively, first, the separation of the bonded structure may be started using a solid wedge, and the bonded structure may then be completely separated using a fluid wedge.

In this step, the release layer 2 after separation may remain at the semiconductor layer side of the first semiconductor substrate 11, at the second semiconductor substrate 1 side, or both the semiconductor layer side of the first semiconductor substrate 11 and the second semiconductor substrate 1 side. In particular, when a stacked layer including at least two porous layers composed of porous materials having different porosities is used as the release layer 2, cracks are formed in one of the porous layers having a relatively high porosity near the interface of the porous layers. Consequently, the semiconductor substrates are separated along the interface of the porous layers.

As a result, the thickness of the remaining porous layer becomes uniform over the entire surface of the semiconductor substrate having an integrated circuit formed thereon. Furthermore, a similar structure 101 is also formed in an adjacent region (refer to FIG. 5C). In an example of an alternative separation method, porous silicon constituting the release layer 2 may be selectively etched using a mixed solution containing hydrogen fluoride and hydrogen peroxide or a mixed solution containing hydrogen fluoride, ammonium fluoride, and hydrogen peroxide. In such a case, the release layer composed of the porous material shown in FIG. 5C hardly remains on the exposed surface of the transferred semiconductor layer 3.

In the case where the release layer 2 remains, as required, the remaining release layer 2 is removed by, for example, etching using the above-mentioned mixed solution to expose the reverse surface of the semiconductor layer 3. The reverse surface of the semiconductor layer 3 is etched until the through-electrodes 4 are exposed. Electrically bonding portions 8 are then formed with solder, gold, or the like.

Figure 5D:
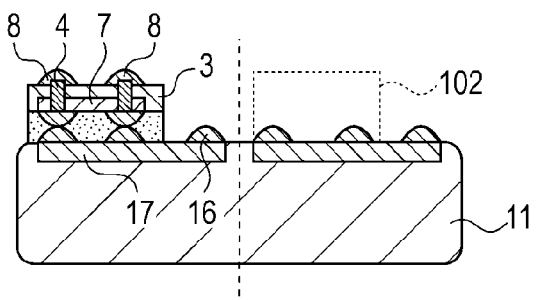
FIG. 5D is a schematic cross-sectional view illustrating the method of manufacturing the semiconductor device according to the other embodiment of the present invention.

As a result, as shown in FIG. 5D, a structure in which two integrated circuits 7 and 17 having different chip sizes are stacked is obtained. Furthermore, a similar structure 102 is also formed in the adjacent region. When the number of layers of an integrated circuit to be stacked is two, grooves are formed in a region (represented by the broken line in FIG. 5D) between adjacent integrated circuits with a dicing saw to cut the bonded structure. Thus, dicing is conducted so that the respective integrated circuits are independently separated into chips.

Figure 5E:
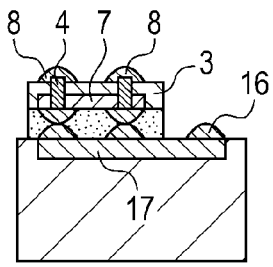
FIG. 5E is a schematic cross-sectional view illustrating the method of manufacturing the semiconductor device according to the other embodiment of the present invention.

Thus, as shown in FIG. 5E, a stacked chip including at least the first integrated circuit 7 having a small chip size and the second integrated circuit 17 having a large chip size, that is, a three-dimensionally mounted semiconductor device can be manufactured.

Fifth Embodiment

In this embodiment, three or more semiconductor layers or semiconductor substrates each having an integrated circuit formed therein are stacked.

First, a structure 30 that is the same as the structure shown in FIG. 5D, the structure being obtained in the fourth embodiment, is prepared. In this embodiment, an example in which electrically bonding portions do not have a convex shape will be described. In addition, a structure 31 that is the same as the structure shown in FIG. 5A is also prepared.

Subsequently, as in the fourth embodiment, a structure including the semiconductor substrate 1 which is diced to have a chip size of the integrated circuit 7, the release layer 2, the semiconductor layer 3, the integrated circuit 7, the through-electrodes 4, and the electrically bonding portions 6 is bonded to the structure 30 with an adhesive therebetween. In addition, a structure having the same structure as the above is also bonded onto an adjacent integrated circuit 17.

Subsequently, separation is conducted as in the fourth embodiment so that a semiconductor layer 23 having a third integrated circuit 27 formed therein, the chip size of the third integrated circuit 27 being the same as that of the integrated circuit 7, is transferred to the exposed surface of the semiconductor layer 3 that has been stacked on a semiconductor substrate 11 in advance. The reverse surface of the semiconductor layer 23 is then etched until through-electrodes 24 are exposed. Electrically bonding portions 28 connected to the through-electrodes are then formed with solder, gold, or the like. Thus, a stacked structure including three or more integrated circuit layers is obtained.

Furthermore, grooves are formed in a region (represented by the broken line in FIG. 6A) between adjacent integrated circuits with a dicing saw to cut the bonded structure. Thus, dicing is conducted so that the respective integrated circuits are independently separated into chips.

Figure 6A:
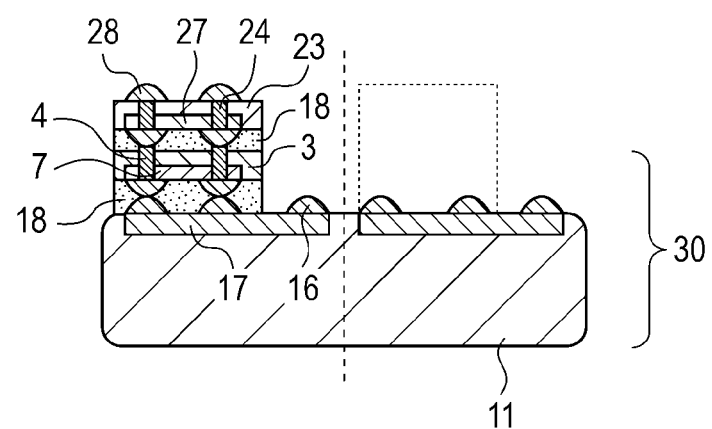
FIG. 6A is a schematic cross-sectional view illustrating a method of manufacturing a semiconductor device according to another embodiment of the present invention.
Figure 6B:
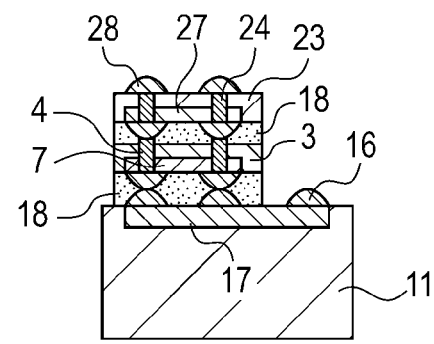
FIG. 6B is a schematic cross-sectional view illustrating the method of manufacturing the semiconductor device according to the other embodiment of the present invention.

FIG. 6B shows a stacked chip in which at least three integrated circuits 7, 17, and 27 are stacked, that is, a three-dimensionally mounted semiconductor device thus obtained. Subsequently, the semiconductor device is die-bonded on a mounting substrate composed of, for example, a metal, a ceramic, or an insulating sheet having metal wiring thereon and then packaged. In FIG. 6B, the dimension in the vertical direction is enlarged. However, in reality, the chip size (the length in the horizontal direction in the figure) is significantly larger than the thickness (the length in the vertical direction in the figure).

In the above embodiment, the integrated circuits 17, 7 and 27 formed on the first semiconductor substrate 11, the semiconductor layer 3, and the semiconductor layer 23, respectively, may be the same circuit or different circuits. More preferably, the integrated circuits 7 and 27 are the same circuit, and the integrated circuit 17 is a different circuit having a larger circuit scale. As the integrated circuits 7 and 27, a semiconductor memory, such as a DRAM, which requires a memory holding operation, or a nonvolatile semiconductor memory, such as an EEPROM or an MRAM, which are called flash memory, can be used. The number of stacks is also not limited to 2, as shown in the figure. The number of stacks may be 8 or more, and more preferably 12 or more. On the other hand, the integrated circuit 17 can be the above-mentioned logic IC having a larger circuit scale than that of the integrated circuit 7 or 27. Furthermore, the first semiconductor substrate 11 may be formed as a thin layer.

In this embodiment, a description has been made of a process of sequentially stacking small chips including the integrated circuits 7 and 27. However, the present invention is not limited thereto. Alternatively, a support substrate for a temporary support may be used. A chip having an integrated circuit 7 and a chip having an integrated circuit 27 may be sequentially stacked on the support substrate. Subsequently, the support substrate may be bonded to a semiconductor substrate 11 in which an integrated circuit 17 to be formed into a large chip is formed, and dicing may then be conducted as shown in FIG. 6A.

Sixth Embodiment

This embodiment is shown by a partially enlarged view of a stacked chip obtained by a method of manufacturing a semiconductor device of the present invention.

FIG. 4 shows a cross section of a portion where three integrated circuits having a small chip size are stacked. Another integrated circuit chip (not shown) having a large chip size is disposed on the lower part of FIG. 4. A stacked chip of this embodiment is obtained by stacking the structure shown in FIG. 4 on the other integrated circuit chip.

Through-electrodes 4 are provided through a semiconductor layer 3 which includes an integrated circuit 7, such as a semiconductor memory, having a small chip size. Solder bumps 8 functioning as electrically bonding portions are provided on the semiconductor layer 3. A semiconductor layer 23 which includes an integrated circuit 27 composed of the same semiconductor memory as the above is stacked on the solder bumps 8. Through-electrodes 24 are formed through the semiconductor layer 23, and solder bumps 28 functioning as electrically bonding portions are provided on the semiconductor layer 23.

Furthermore, a semiconductor layer 33 which includes an integrated circuit 37 composed of a semiconductor memory is stacked on the solder bumps 28. In this embodiment, a release layer 32 is not removed but is left on the top semiconductor layer 33.

A through-electrode 34 is arranged so as to be superposed on the lower through-electrodes 24 and 4. These through-electrodes are short-circuited so as to provide conduction therebetween. In each of the semiconductor layers 3, 23, and 33, since the inner walls of the through-holes are covered with insulating films, each of the semiconductor layers 3, 23, and 33 is not short-circuited with the insides of the through-holes. On the other hand, the release layer 32, which is composed of a porous material and which is left on the surface of the top semiconductor layer 33, is a low-resistance layer composed of silicon containing a high concentration of boron. Accordingly, the release layer 32 is short-circuited with the through-electrode 34 so that the release layer 32 can be used as an electrical shield layer, thereby preventing malfunction of the stacked chip, electrostatic discharge damage, and the like. The through-electrode 34 and the through-electrodes 4 and 24 connected thereto function as a body contacts that electrically short-circuit P-type body portions of the semiconductor layers. The body contacts electrically short-circuit the P-type body portions (common portions of separated semiconductor layers) of pMOS transistors, in which N-type semiconductor wells are formed, through wiring layers (not shown) and are grounded. Alternatively, a P$^+$-semiconductor layer doped at a high concentration or a metal layer may be provided instead of the release layer 32 composed of a porous material.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-092317, filed Apr. 6, 2009 and No. 2009-092318, filed Apr. 6, 2009 which are hereby incorporated by reference herein in their entirety.

The invention claimed is:

1. A method of manufacturing a semiconductor device comprising the steps of:
    forming a plurality of first integrated circuits on the surface side of a first semiconductor substrate;
    forming a plurality of second integrated circuits in a semiconductor layer that is formed on a release layer provided on a second semiconductor substrate;
    bonding the first semiconductor substrate to the second semiconductor substrate so that electrically bonding portions of the first integrated circuits are bonded to electrically bonding portions of the second integrated circuits to form a bonded structure;
    separating the second semiconductor substrate from the bonded structure at the release layer to transfer, to the first semiconductor substrate, the semiconductor layer in which the plurality of second integrated circuits are formed; and
    dicing the first semiconductor substrate to which the plurality of second integrated circuits are transferred to obtain stacked chips each including the first integrated circuit and the second integrated circuit, wherein, after the step of bonding the first semiconductor substrate to the second semiconductor substrate, a sealing member is formed around the bonded structure, and an adhesive is introduced from an opening provided in the sealing member into an area where the electrically bonding portions are not provided to bond the first semiconductor substrate to the second semiconductor substrate with the adhesive.

2. The method according to claim 1, wherein the second integrated circuits include through-electrodes connected to the corresponding electrically bonding portions.

3. A method of manufacturing a semiconductor device comprising the steps of:
    forming a plurality of first integrated circuits on the surface side of a first semiconductor substrate;
    forming a plurality of second integrated circuits in a first semiconductor layer that is formed on a first release layer provided on a second semiconductor substrate;
    bonding the first semiconductor substrate to the second semiconductor substrate so that electrically bonding portions of the first integrated circuits are bonded to electrically bonding portions of the second integrated circuits to form a first bonded structure;
    separating the second semiconductor substrate from the first bonded structure at the first release layer to transfer, to the first semiconductor substrate, the first semiconductor layer in which the plurality of second integrated circuits are formed;
    forming a plurality of third integrated circuits in a second semiconductor layer that is formed on a second release layer provided on a third semiconductor substrate;
    bonding the first semiconductor layer to the second semiconductor layer so that electrically bonding portions of the second integrated circuits are bonded to electrically bonding portions of the third integrated circuits to form a second bonded structure;
    separating the third semiconductor substrate from the second bonded structure at the second release layer to transfer, to the first semiconductor substrate, the second semiconductor layer in which the plurality of third integrated circuits are formed; and
    dicing the first semiconductor substrate to which the plurality of second integrated circuits and third integrated circuits are transferred to obtain stacked chips each including the first integrated circuit, the second integrated circuit, and the third integrated circuit, wherein, after the step of bonding the first semiconductor substrate to the second, a sealing member is formed around the bonded structure, and an adhesive is introduced from an opening provided in the sealing member into an area where the electrically bonding portions are not provided to bond the first semiconductor substrate to the second semiconductor substrates with the adhesive.

4. The method according to claim 3, wherein an electrical shield layer that is short-circuited to a through-electrode is formed on the surface of the semiconductor layer disposed at the top.

5. The method according to claim 1, wherein
    the chip size of the second integrated circuits being smaller than that of the first integrated circuits.

6. The method according to claim 5, wherein the second integrated circuits include through-electrodes connected to the corresponding electrically bonding portions.

7. The method according to claim 3, wherein
    the chip size of the second integrated circuits being smaller than that of the first integrated circuits.

8. The method according to claim 7, wherein an electrical shield layer that is short-circuited to a through-electrode is formed on the surface of the semiconductor layer disposed at the top.

* * * * *